United States Patent
Jin

(10) Patent No.: US 7,280,654 B2
(45) Date of Patent: Oct. 9, 2007

(54) MODIFIED AFFINE PROJECTION ALGORITHM FOR NON-STATIONARY SIGNAL

(75) Inventor: Gary Q. Jin, Kanata (CA)

(73) Assignee: Zarlink Semiconductor Inc., Kanata, ON (CA)

( * ) Notice: Subject to any disclaimer, the term of this patent is extended or adjusted under 35 U.S.C. 154(b) by 428 days.

(21) Appl. No.: 10/944,832

(22) Filed: Sep. 21, 2004

(65) Prior Publication Data

US 2005/0111656 A1   May 26, 2005

(30) Foreign Application Priority Data

Sep. 24, 2003   (GB) ................... 0322345.0

(51) Int. Cl.
*H04M 9/08*   (2006.01)
(52) U.S. Cl. .............. 379/406.08; 379/406.11
(58) Field of Classification Search ............. None
See application file for complete search history.

(56) References Cited

U.S. PATENT DOCUMENTS

| | | | | |
|---|---|---|---|---|
| 6,137,881 A | * | 10/2000 | Oh et al. ............... | 379/406.08 |
| 6,744,886 B1 | * | 6/2004 | Benesty et al. ........ | 379/406.08 |
| 6,788,785 B1 | * | 9/2004 | Ding ..................... | 379/406.08 |
| 6,909,782 B2 | * | 6/2005 | Bershad et al. ........ | 379/406.08 |

OTHER PUBLICATIONS

Gay, Steven L., "Dynamically regularized fast RLS with application to echo cancellation", IEEE, 1996, pp. 957-960.

* cited by examiner

*Primary Examiner*—Ramnandan Singh
(74) *Attorney, Agent, or Firm*—Marks & Clerk; Richard J. Mitchell

(57) ABSTRACT

An affine projection or like algorithm is used to process a non-stationary signal. The affine projection algorithm creates an inverse matrix and includes a factor γ to avoid numerical instability in the inverse matrix. The factor γ is adaptively adjusted according to the characteristics of the signal.

12 Claims, 5 Drawing Sheets

MODIFIED AFFINE PROJECTION ALGORITHM FOR NON-STATIONARY SIGNAL

FIELD OF THE INVENTION

This invention relates to digital signal processing, and in particular to a method of processing a non-stationary signal, such as a speech signal, for example, for use in echo cancellation in speakerphone technology.

BACKGROUND OF THE INVENTION

A typical echo cancellation application is shown in FIG. 1. The transmitted speech or signal is fed back to the received end becoming echo to the incoming speech. The echo reflection is caused by either impedance mismatch as in a network application or room reflection in an acoustical application. The echo will distort the incoming signal and speech.

In telephony application, the echo is very annoying to the people on the phone. An adaptive algorithm is always applied to monitor the echo path and its variation so that it can be replicated by a linear filter and then subtracted from the incoming signal. For the telephony application, the speech signal is non-stationary and has a huge dynamic range.

One adaptive algorithm is known as the Affine Projection Algorithm(APA), K. Ozeki and T. Umeda, "An Adaptive Filtering Algorithm Using an Orthogonal Projection to an Affine Subspace and Its Properties", Electronics and Communications in Japan, Vol.67-A, No.5, 1984. This is a generalization of the well known normalized least mean square (NLMS) adaptive algorithm. It has a much faster convergence rate than the LMS algorithm and its fast implementation has similar computational complexity as the LMS algorithm.

The LMS algorithm can be seen as a special case of APA where the projection order is 1. With the increase of projection order, the APA starts showing a dramatic increase of convergence speed. When the projection order is over 5, the increase of converge speed shows only a slight improvement. When the projection order increases to the order of filter size, the APA becomes the Recursive Least Square Algorithm (RLS).The APA is a very attractive algorithm which has the same complexity as LMS but is able to achieve RLS performance. In general, the convergence speed doubles with a doubling of projection order.

The original APA needs more data memory than the NLMS algorithm and its complexity is equivalent to the N times of NLMS algorithm (here N is the order of projection. However, because of information and data reuse, many computation procedures can be saved and reused. This is the fundamental idea of the Fast Affine Projection (FAP) algorithm. However, the APA involves an Nth-order matrix inverse. There are different methods available for the matrix inverse which differentiates various algorithms with different performance, complexity and stability. The most important issue is that no matter what methods are, the problem of non-stability with large matrix inverse remains, especially with its fast operation and finite precision implementation. Singular value decomposition, J. Cioffi and T. Kailath, "Windowed Fast Transversal Filters Adaptive Algorithms with Normalization", IEEE Trans. on ASSP, Vol.ASSP-33, No.3, June 1985, is the most stable implementation of matrix inverse and its only problem is its computational complexity.

When dealing with a large matrix, there is always the singularity problem. With finite precision and fixed point implementation, the inverse of singular matrix will make the whole system very unstable because the smallest eigenvalue dominates the whole inverse matrix. In either APA or FAP algorithms, an identity matrix multiplied by a small constant is added to the inverse matrix so that the matrix will never become a singularity. However, this constant will cause performance degradation for the adaptive system. If this constant is too big, the performance degradation is severe and if this constant is too small, system stability cannot be maintained unless more data precision is employed in the echo cancellation.

SUMMARY OF THE INVENTION

According to the present invention there is provided a method of processing a non-stationary signal comprising applying an adaptive echo cancellation algorithm that creates an inverse matrix to said non-stationary signal, and adaptively adjusting the condition of said matrix according to the characteristics of said signal.

The adaptive echo cancellation algorithm may be an affine projection algorithm including a factor $\gamma$ to avoid numerical instability in said inverse matrix. In this case the factor $\gamma$ is adaptively adjusted.

This method in accordance with the invention makes the algorithm much more stable and more able to track a speech signal with non-stationary properties. It also stabilizes the algorithm for higher order implementations.

The novel method can be applied to other adaptive echo cancellation algorithm where the matrix inverse is required, such as the PNLMS (Proportionate Normalized Least-Mean-Squares) algorithms. The method can also be applied to an FAP algorithm with a forgetting factor $\alpha$ close to 1.

In the method in accordance with the invention the APA can be used adaptively track the echo path change and then cancel the echo from the incoming signal.

The novel method of the invention can, for example, be implemented in a digital signal processor.

Test results show that with an adaptive matrix condition, the echo cancellation is similar to that using the singular value decomposition for low order APA and it is much better than constant approach. For a high order APA, the adaptive matrix condition approach outperforms singular value decomposition.

BRIEF DESCRIPTION OF THE DRAWINGS

The invention will now be described in more detail, by way of example only, with reference to the accompanying drawings, in which:—

DETAILED DESCRIPTION OF THE INVENTION

Figure 1:
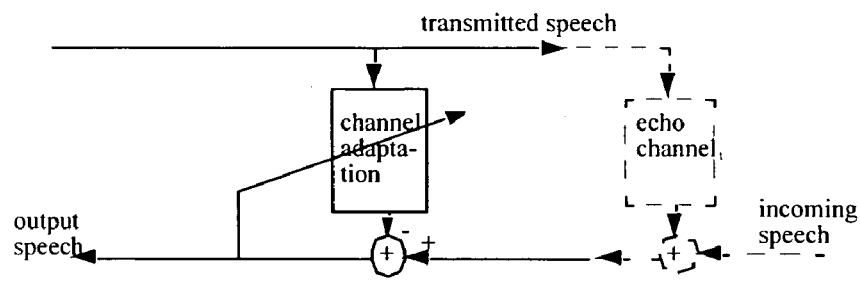
FIG. 1 shows a prior art echo cancellation circuit.

The prior art Affine Projection Algorithm (APA) can be summarized as follows:

Initialization:

$$\underline{x}(0)=\underline{w}(0)=[0, 0, \ldots, 0]^T$$

for k>0, $$\underline{e}(k)=\underline{d}(k)-\underline{X}^T(k)\underline{w}(k)$$

$$\underline{w}(k+1)=\underline{w}(k)+\mu\underline{X}(k)(\underline{X}^T(k)\underline{X}(k)+\gamma\underline{I})^{-1}\underline{e}(k)$$

where $$\underline{d}(k)=[d(k),d(k-1),\ldots,d(k-N)]^T$$

is the desired output.

$$\underline{w}(k)=[w_0(k), w_1(k), \ldots, w_{L-1}(k)]^T$$

is the weighting vector.

$$\underline{X}(k)=[\underline{x}(k),\underline{x}(k-1),\ldots,\underline{x}(k-N)]$$

$$\underline{x}(k)=[x(k), x(k-1), \ldots, x(k-L)]^T$$

and with x(k) being the reference signal at instant k. $0 \leq \mu \leq 2$ is the convergence step size, playing the same control role as in the LMS algorithm. $\gamma$ is a small constant to avoid numerical instability in the matrix inverse. Normally, $\gamma$ is chosen to be 30 dB below the peak value of the diagonal element of $\underline{X}^T(k)\underline{X}(k)$, or $\gamma=\max(x(k)*x(k))*L/1000$. For the non-stationary signal with large magnitude variation such as speech signal, the choice of $\gamma$ affects the adaptation convergence rate and final residual error.

The detailed FAP algorithm is described in S. L. Gay and S. Tavathia, "The Fast Affine Projection Algorithm", ICASSP'95 Proceedings, pp.3023-3026; H. Ding, "A stable fast affine projection adaptation algorithm suitable for low-cost processors", ICASSP 2000, Turkey, pp.360-363. In the derivation, one assumption has been used in the approximated fast residual echo vector calculation:

$$\underline{e}(k) \approx \begin{bmatrix} e(k) \\ (1-\mu)\overline{\underline{e}}(k-1) \end{bmatrix}$$

(where $\overline{\underline{e}}(k-1)$ is the upper N-1 elements of vector $\underline{e}(k-1)$). This approximation is valid only if following condition satisfies $\gamma \ll \lambda_{i, k-1}$, where $\lambda_{i, k-1}$ is the ith eigenvector of matrix $\underline{X}^T(k-1)\underline{X}(k-1)$. In general, if $\gamma$ is too big, the FAP performance will be affected and if $\gamma$ is too small, the matrix inverse may become unstable, especial with finite precision implementation.

Since the choice of $\gamma$ affects the APA and FAP performance and stability, in accordance with the principles of the invention the value of $\gamma$ is adaptively adjusted based on signal characteristics. Two embodiments are described.

FIRST EMBODIMENT

The value of $\gamma$ is set at 30 dB below the average power of last N signal set. In other words, $\gamma$ is set at 30 dB below the average diagonal element of matrix $\underline{X}^T(k)\underline{X}(k)$. The equation can be written as $$\Upsilon = \frac{1}{1000N} \sum \mathrm{diag}(\underline{X}^T(k)\underline{X}(k))$$

This will ensure that the maximum eigen spread will be 1000N. To avoid the becoming zero or close to zero, in which case, the eigenspread is undefined (0/0), the above equation can be modified as:

$$\Upsilon = \max\left(\frac{1}{1000N} \sum \mathrm{diag}(\underline{X}^T(k)\underline{X}(k)), c\right)$$

where c is a constant representing the minimum precision in the signal representation. For the fixed point representation we can choose c=1, or a little larger than 1. With the definition of $\underline{X}_T(k)$, the main components of the above equation can be written as:

$$\sum \mathrm{diag}(\underline{X}^T(k)\underline{X}(k)) = \sum_{i=k-N}^{k} R(0, i)$$

where $$R(0, k) = \sum_{i=0}^{L} x(k-i)x(k-i)$$

The relation between R(0, k) and R(0, k-1) is $$R(0,k)=R(0,k-1)+x(k)x(k)-x(k-L-1)x(k-L-1)$$

and the iterative relation is $$\Sigma \mathrm{diag}(\underline{X}^T(k)\underline{X}(k))=\Sigma \mathrm{diag}(\underline{X}^T(k-1)\underline{X}(k-1))+R(0,k)-R(0,k-N-1)$$

Figure 2:
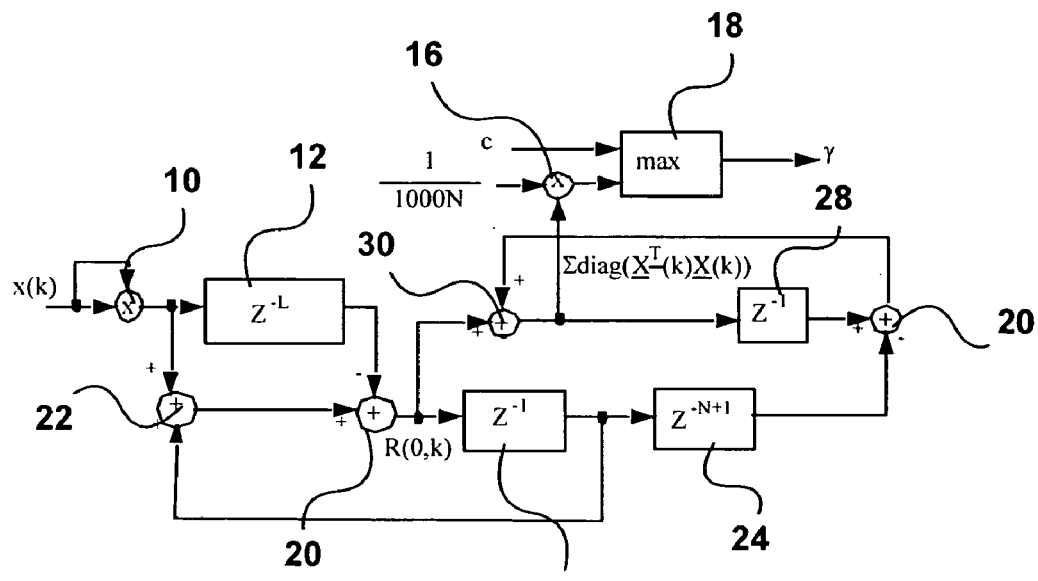
FIG. 2 is a diagram showing a practical implementation of an echo canceller in accordance with a first embodiment of the invention.

This will give an implementation diagram as shown in FIG. 2. Input signal x(k) is multiplied by itself in multiplier 10 and passed through delay unit 12 to adder 14 and from there to the input of delay unit 20 and adder 30.

The output of delay unit 20 is fed added to the output of adder 10 in adder 22 and fed to adder 14.

The output of delay unit 20 is passed to delay unit 24 and added in adder 26 to the output of delay unit 28, which receives its input from adder 30.

The output of adder 30 is also fed to multiplier 32, which receives as its other input 1/1000N and then fed to maximization unit 18. The other input of maximization unit 18 is a constant value c. The output of unit 18 is the adaptively adjusted factor $\gamma$.

Figure 3:
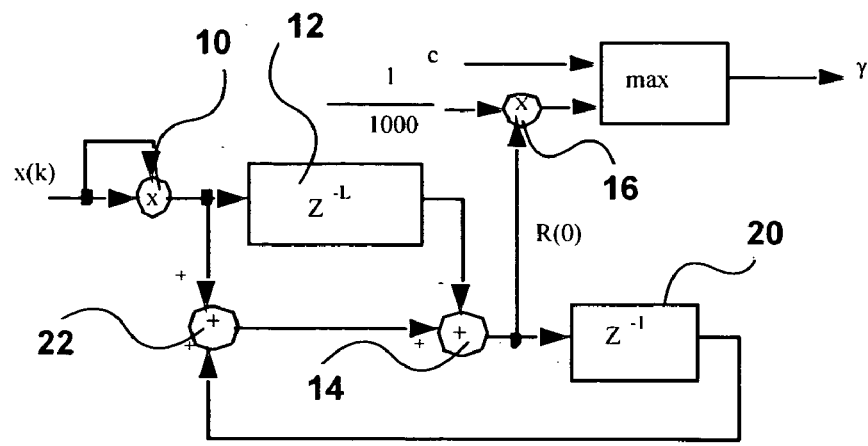
FIG. 3 is a simplified version of the implementation shown in FIG. 2.

In most cases, L>>N and the diagonal elements in the matrix $\underline{X}_T(k)\underline{X}(k)$ would not have large variations from samples to samples. Therefore, as a simplified version, γ can be chosen as $$\Upsilon = \max\left(\frac{1}{1000N}\sum_{i=0}^{L} x(k-i)x(k-i), c\right)$$

which gives a much simplified implementation as shown in FIG. 3.

SECOND EMBODIMENT

This embodiment uses the estimated signal power R(0) as the basis and γ is chosen as 30 dB below that value. The estimated value R(0) is $$R(0) = \alpha R(0) + (1-\alpha)\sum_{i=0}^{L} x(k-i)x(k-i)$$

where $0 \leq \alpha \leq 1$ is the forgetting factor. γ is calculated as:

$$\Upsilon = \max\left(\frac{1}{1000}R(0), \frac{1}{4000}\sum_{i=0}^{L} x(k-i)x(k-i), c\right)$$

where c is defined in the same way as before and the second term is used to control the initial value when x(k) just starts to become meaningful input.

Figure 4:
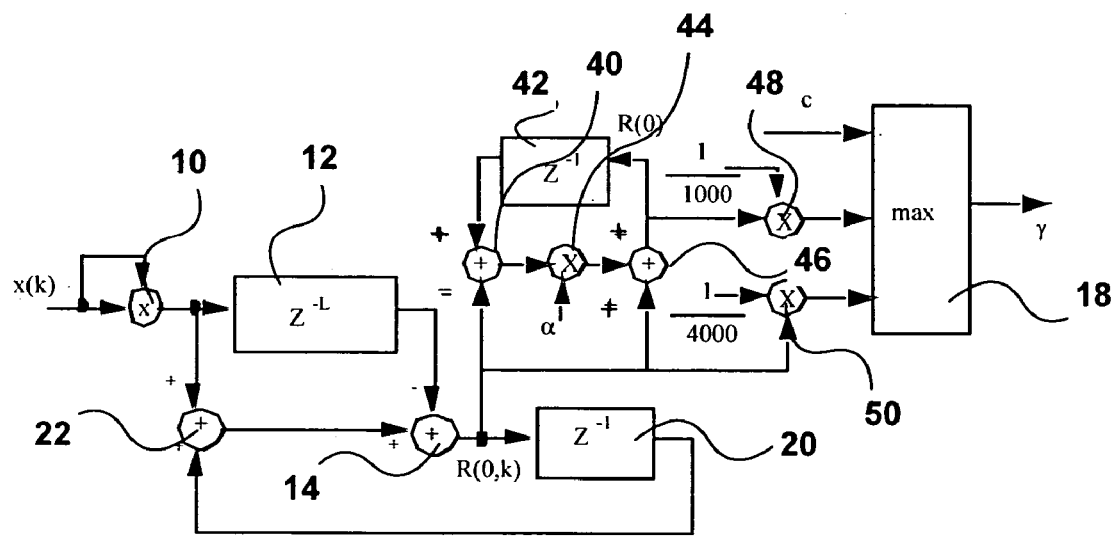
FIG. 4 is a diagram showing a practical implementation of an echo canceller in accordance with a second embodiment of the invention.

The practical implementation for this embodiment is shown in FIG. 4. The output of adder 14 is fed to subtractor 40, having one input receiving the output of delay unit 42.

The output of adder 40 is fed to multiplier 44, whose output is fed to the input of adder 46.

The output of adder 14 is also fed to the input of multiplier 50 whose output is fed to an input of maximization unit 18. A third input of maximization unit 18 receives an output of multiplier 48, which receives one input from the output of adder 46 and another input which represents a constant value.

Figure 5:
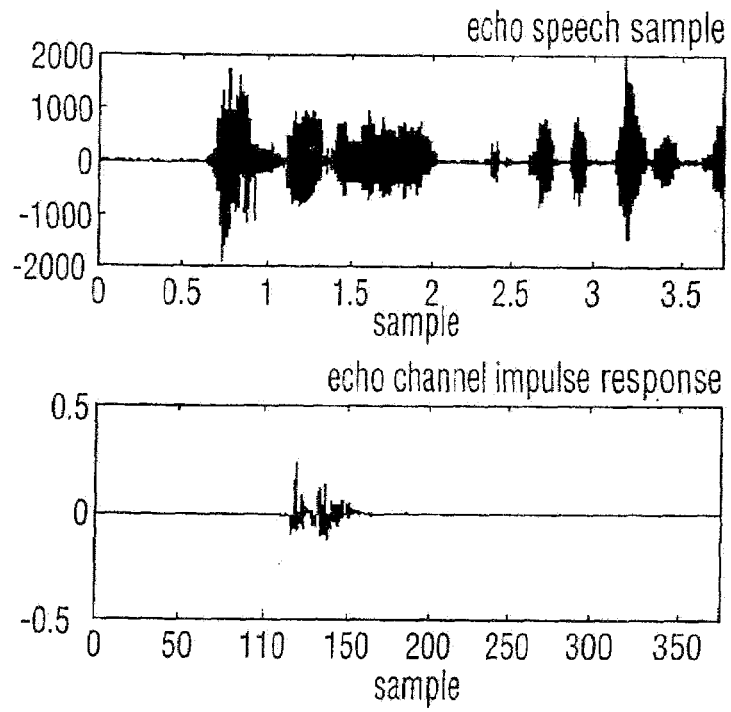
FIG. 5 shows a simulation echo speech signal and the echo path.
Figure 6:
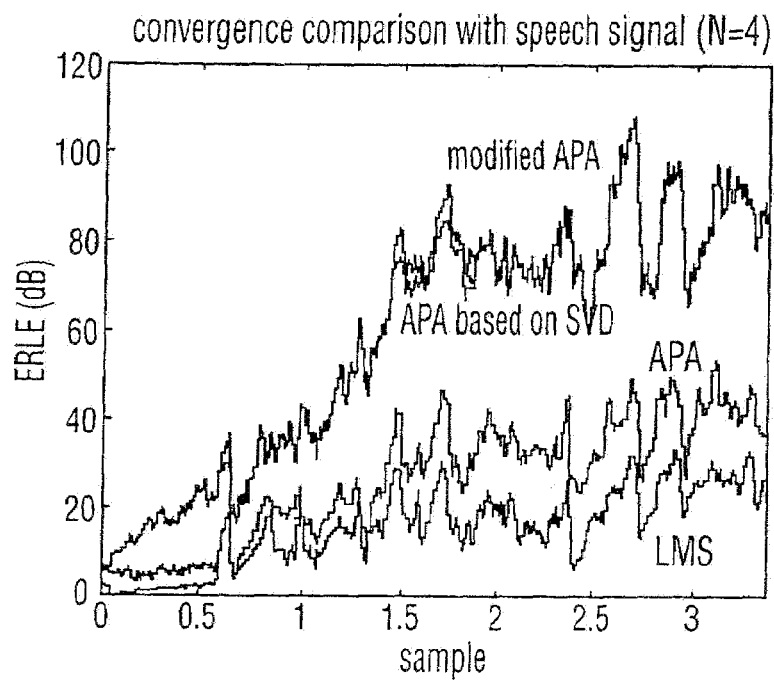
FIG. 6 shows the convergence comparison between different algorithms.

FIG. 5 shows the simulation echo speech signal and the echo path and FIG. 6 shows the convergence comparison between different algorithms with N=4 for APA based algorithms.

The second embodiment is applied for the modified APA algorithm (the simulations show that both the first and second embodiments perform very similarly). From FIG. 6, it can be seen that the APA algorithm barely outperforms the LMS algorithm and the modified APA performance has a much faster convergence rate and better ERLE. The modified APA based on the adaptive matrix condition estimation a similar echo cancellation performance as an SVD based APA. But the SVD implementation is much more complicated and very expensive for implementation.

Figure 7:
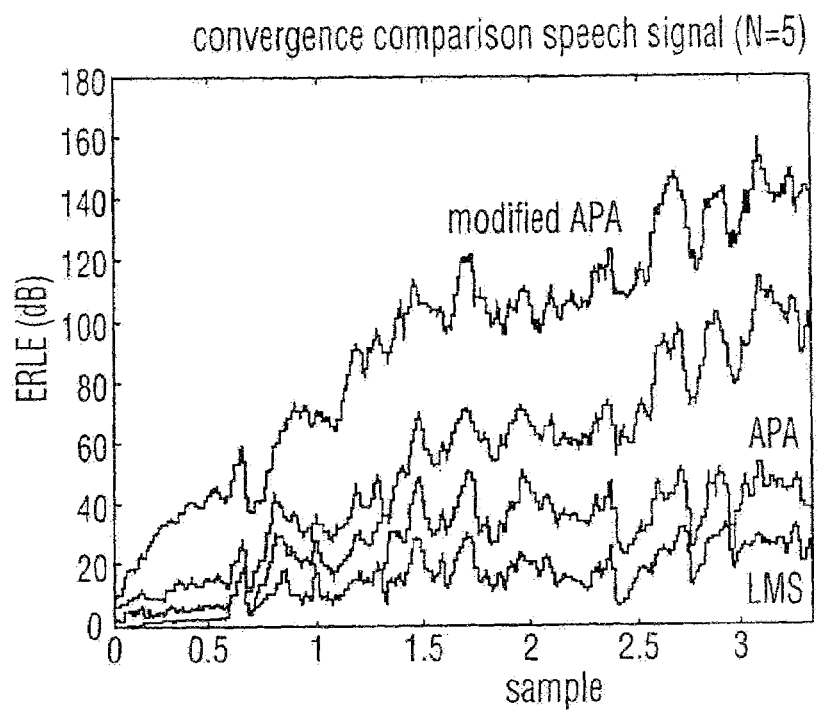
FIG. 7 shows an example with high order APA.

FIG. 7 shows an example with high order APA. Once again, this shows that the normal APA algorithm barely outperforms the LMS algorithm and the modified APA has a much faster convergence rate and better ERLE than the others.

Figure 8:
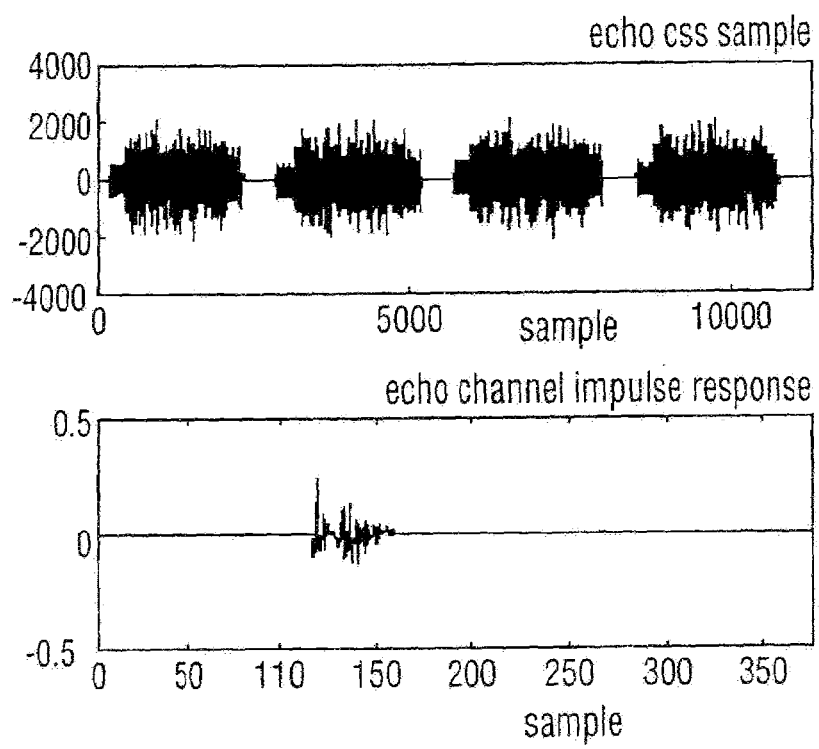
FIG. 8 shows the simulated CSS (Composite Source Signal) echo with its echo path.

FIG. 8 shows the simulated CSS (Composite Source Signal) echo with its echo path. The CSS signal is a pseudo speech signal used to test echo cancellation performance in the ITU-T standard.

Figure 9:
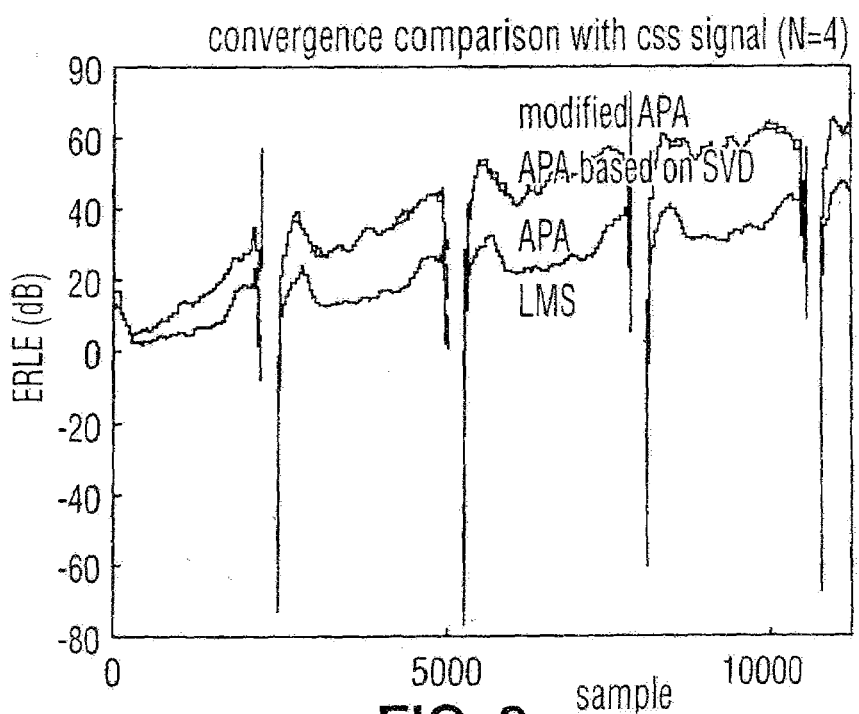
FIG. 9 shows the echo cancellation performance comparison for the projection dimension N=4.
Figure 10:
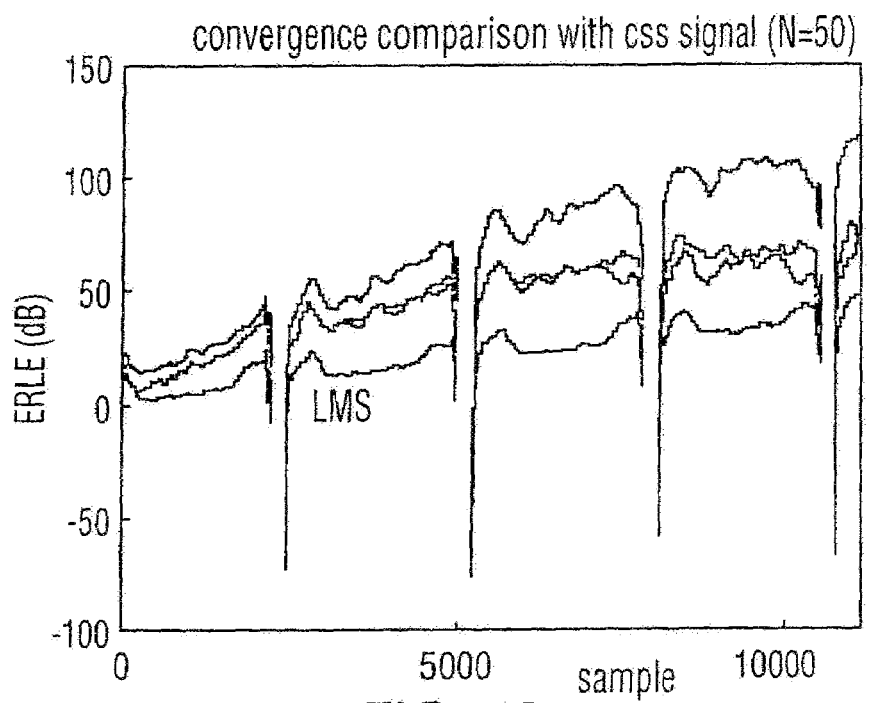
FIG. 10 shows the echo cancellation performance comparison for the projection dimension N=50.

FIGS. 9 and 10 show the echo cancellation performance comparison for the projection dimension N=4 and 50 respectively. Due to the fact that the CSS signal has almost constant magnitude, the normal APA performances is much better than the LMS algorithm. For N=4, the performance all three APA based algorithms is quite similar. This tells us that the APA with constant matrix condition value γ performs very well for a signal with stable magnitude, and the modified APA based on the adaptive matrix condition estimation outperforms other algorithms with high order projection.

The schemes proposed in this paper can be applied to other adaptive echo cancellation algorithms where the matrix inverse is required, such as the PNLMS (Proportionate Normalized Least-Mean-Squares) algorithms described in S. Gay, "An Efficient, Fast Converging Adaptive Filter for Network Echo Cancellation", Proc. Asilomar Conference on Signals, Systems and Computers, Pacific Grove, Calif., 1998; T. Gansler, S. L. Gay, M. M. Sondhi and J. Benesty, "Double-Talk Robust Fast Converging Algorithms for Network Echo Cancellation", IEEE Trans. on Speech and Audio Processing, Vol.8, No.6, November 2000.pp.656-663;D. L. Duttweiler, "Proportionate Normalized Least-Mean-Squares Adaptation in Echo Cancelers", IEEE Trans. on Speech and Audio Processing, Vol8, No.5, September 2000. pp.508-518.

When the invention is applied to an FAP algorithm, similar performance improvement can be achieved. However, the forgetting factor α should be closer to 1 so that γ will only vary slowly. This is because the FAP uses an iterative method to create the matrix inverse and any dramatic change of the matrix with γ being varied will affect the stability of matrix inverse.

All afore-mentioned references are herein incorporated by reference.

I claim:

1. A method of processing a non-stationary signal comprising:
applying an adaptive echo cancellation algorithm that creates an inverse matrix to said non-stationary signal; and
adaptively adjusting the condition of said matrix according to the characteristics of said signal;
wherein said adaptive echo cancellation algorithm is an affine projection algorithm including a factor γ provided to avoid numerical instability in said inverse matrix;
wherein said factor γ is adaptively adjusted in accordance with the characteristics of said signal; and
wherein said factor γ is set to have a value that is a predetermined amount below the average power of the last N set of signal components or the estimated power, where N is the order of projection of the algorithm.

2. A method as claimed in claim 1, wherein said algorithm is a proportionate normalized least-mean-squares (LMS) algorithm.

3. A method as claimed in claim 1, wherein said fixed value is 30 dB.

4. A method as claimed in claim 3, wherein said factor γ is defined by the relationship:

$$\Upsilon = \max\left(\frac{1}{1000N}\sum \text{diag}(\underline{X}^T(k)\underline{X}(k)), c\right).$$

5. A method as claimed in claim 1, wherein said factory γ is chosen to have a fixed value below the estimated signal power.

6. A method as claimed in claim 1, wherein said factor γ is defined by the relationship:

$$\Upsilon = \max\left(\frac{1}{1000}R(0), \frac{1}{4000}\sum_{i=0}^{L}x(k-i)x(k-i), c\right).$$

7. Signal processing apparatus for processing a non-stationary signal comprising:
- an adaptive filter employing an echo cancellation algorithm that creates an inverse matrix to said non-stationary signal; and
- a control unit for adaptively adjusting the condition of said matrix according to the characteristics of said signal, and
- wherein said adaptive echo cancellation algorithm is an affine projection algorithm including a factor γ provided to avoid numerical instability in said inverse matrix;
- wherein said factor γ is adaptively adjusted in accordance with the characteristics of said signal; and
- wherein said factor γ is set to have a value that is a predetermined amount below the average power of the last N set of signal components or the estimated power, where N is the order of projection of the algorithm.

8. Signal processing apparatus as claimed in claim 7, wherein said algorithm is a proportionate normalized least-mean-squares (LMS) algorithm.

9. Signal processing apparatus as claimed in claim 7, wherein said factor γ is defined by the relationship:

$$\Upsilon = \max\left(\frac{1}{1000}R(0), \frac{1}{4000}\sum_{i=0}^{L}x(k-i)x(k-i), c\right).$$

10. Signal processing apparatus as claimed in claim 7, wherein said factor γ is defined by the relationship:

$$\Upsilon = \max\left(\frac{1}{1000}R(0), \frac{1}{4000}\sum_{i=0}^{L}x(k-i)x(k-i), c\right).$$

11. Signal processing apparatus as claimed in claim 7, comprising a plurality of delay units, adders and multipliers, and a maximization unit to produce an output representing γ that is the maximum of two inputs, a first said input derived from said plurality of delay units, adders, and multipliers, and a second said input representing a constant.

12. Signal processing apparatus as claimed in claim 7, further comprising:
- a first input for receiving a first input signal x(k);
- a first delay unit for receiving said first input signal;
- a second delay unit for receiving an output of said first delay unit added to the sum of said input signal and an output of said second delay unit; and
- a maximization unit have first and second inputs, said first input of said maximization unit receiving a constant value and said second input of said maximization unit receiving an input from the input to said second delay unit.

* * * * *